(12) United States Patent
Kretchmer et al.

(10) Patent No.: US 7,139,991 B2
(45) Date of Patent: Nov. 21, 2006

(54) AUTOMATIC METHOD AND SYSTEM FOR INSTANTIATING BUILT-IN-TEST (BIST) MODULES IN ASIC MEMORY DESIGNS

(75) Inventors: Yaron Kretchmer, Fremont, CA (US); Michael Porter, Milpitas, CA (US); Thomas Obrien, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 61 days.

(21) Appl. No.: 11/107,585

(22) Filed: Apr. 14, 2005

(65) Prior Publication Data

US 2005/0204235 A1 Sep. 15, 2005

Related U.S. Application Data

(62) Division of application No. 09/978,141, filed on Oct. 15, 2001, now Pat. No. 6,931,606.

(51) Int. Cl.
G06F 17/50 (2006.01)
G06F 9/45 (2006.01)

(52) U.S. Cl. .................. 716/9; 716/1; 716/12
(58) Field of Classification Search .............. 716/1, 716/9, 12
See application file for complete search history.

(56) References Cited

U.S. PATENT DOCUMENTS

| 5,386,387 | A | * | 1/1995 | Tanizaki | 365/200 |
|---|---|---|---|---|---|
| 5,572,712 | A | | 11/1996 | Jamal | 315/500 |
| 5,828,581 | A | * | 10/1998 | Matumura | 716/12 |
| 6,249,902 | B1 | * | 6/2001 | Igusa et al. | 716/10 |
| 6,493,855 | B1 | | 12/2002 | Weiss et al. | 716/10 |
| 6,578,174 | B1 | | 6/2003 | Zizzo | 716/1 |
| 6,594,799 | B1 | | 7/2003 | Robertson et al. | 716/1 |
| 6,634,008 | B1 | | 10/2003 | Dole | 716/1 |
| 6,728,916 | B1 | | 4/2004 | Chen et al. | 714/733 |

* cited by examiner

*Primary Examiner*—Vuthe Siek
*Assistant Examiner*—Magid Y. Dimyan
(74) *Attorney, Agent, or Firm*—Strategic Patent Group, Inc.

(57) ABSTRACT

A method and system for automatically instantiating built-in-system test (BIST) modules in memory designs is disclosed. The method and system include providing a server over a network that integrates a set of design tools, including an automated front-end software process and an automated back-end software process. According to the method and system, a user may access the server over the network and enter a request for a memory design. The front-end software process is then executed to automatically generate a netlist of a BIST from the user request. Thereafter, the back-end software process is executed to automatically generate a placement and route view of the BIST.

14 Claims, 4 Drawing Sheets

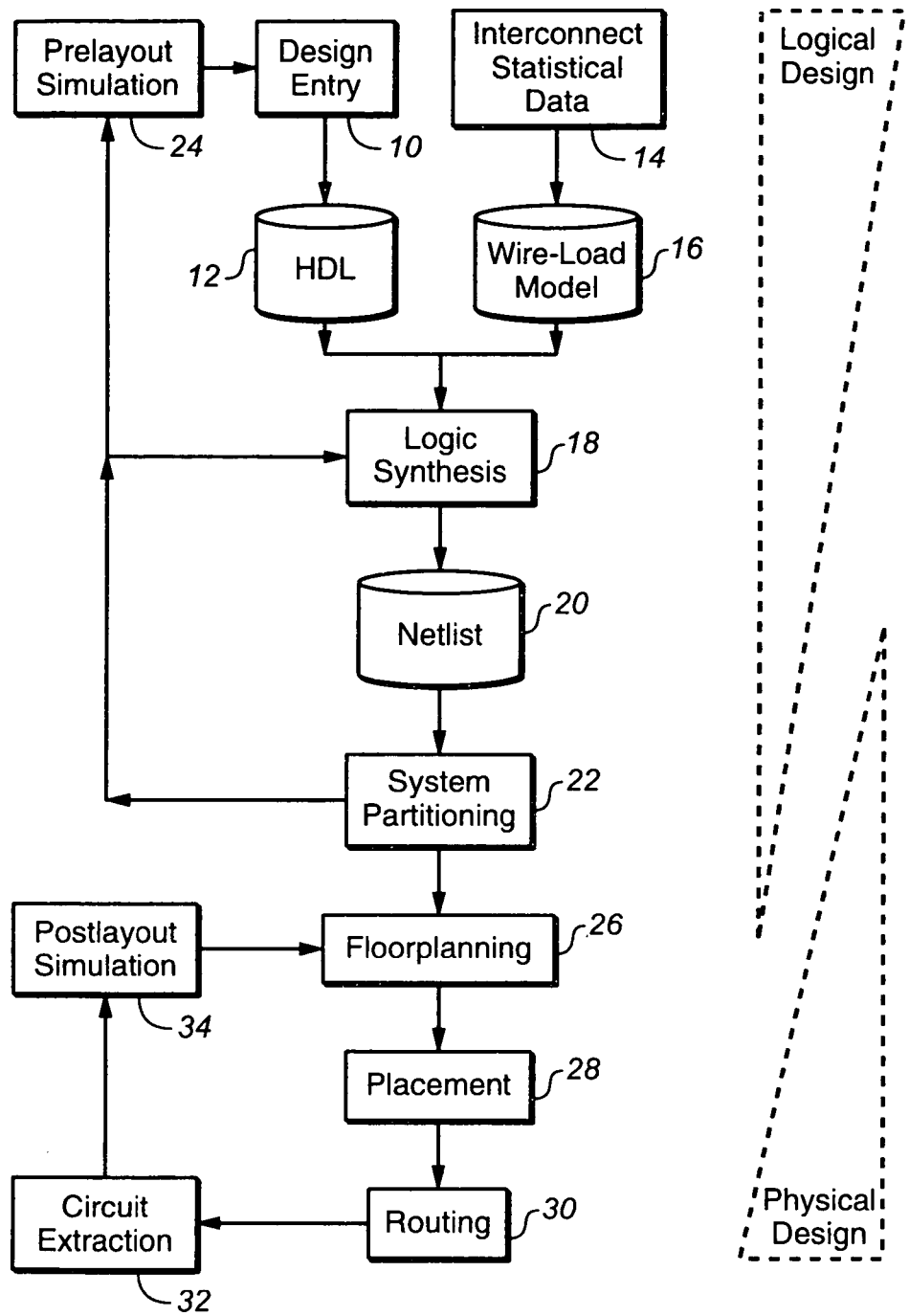
FIG._1
*(PRIOR ART)*

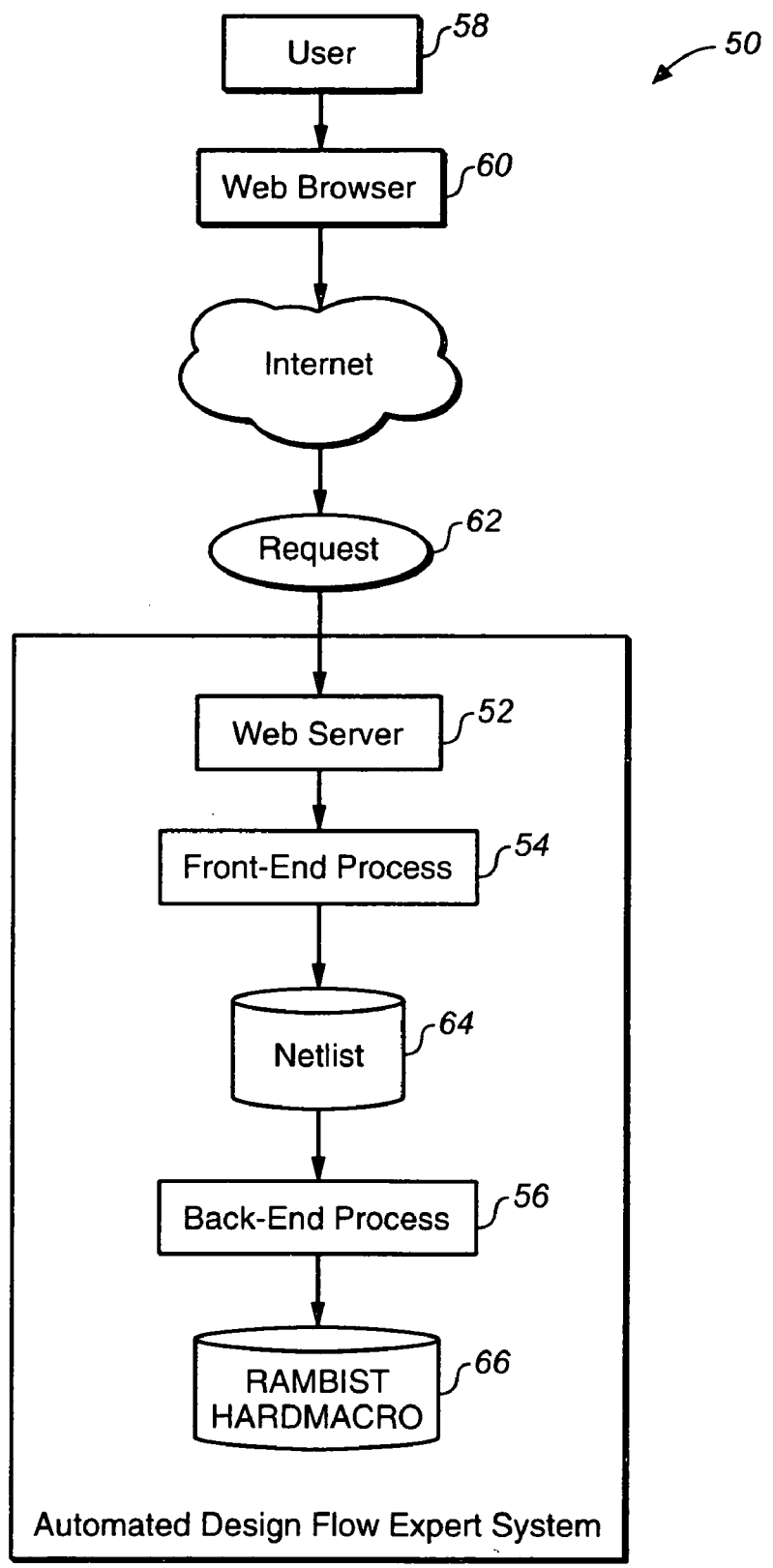
FIG._2

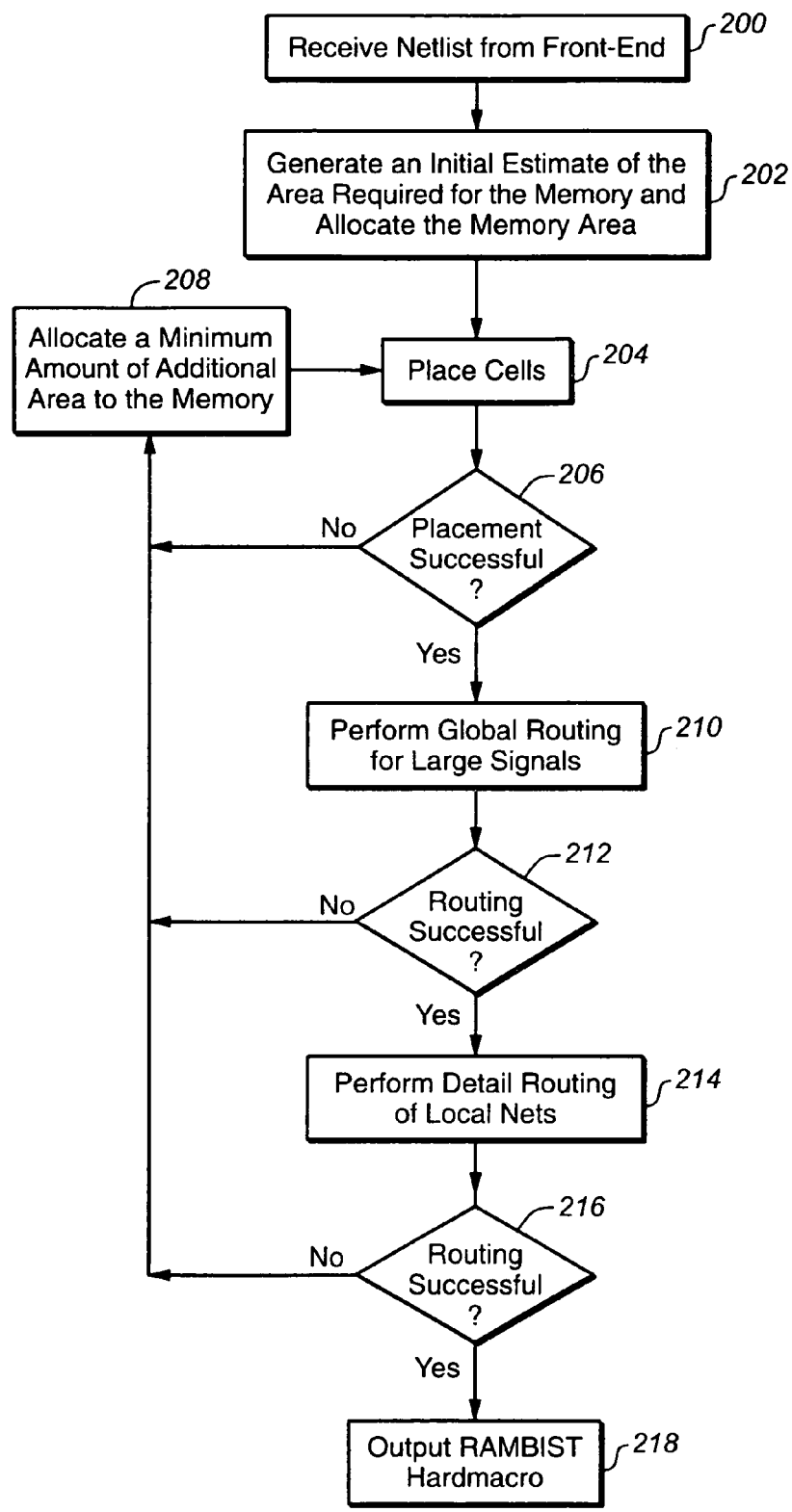
FIG._3

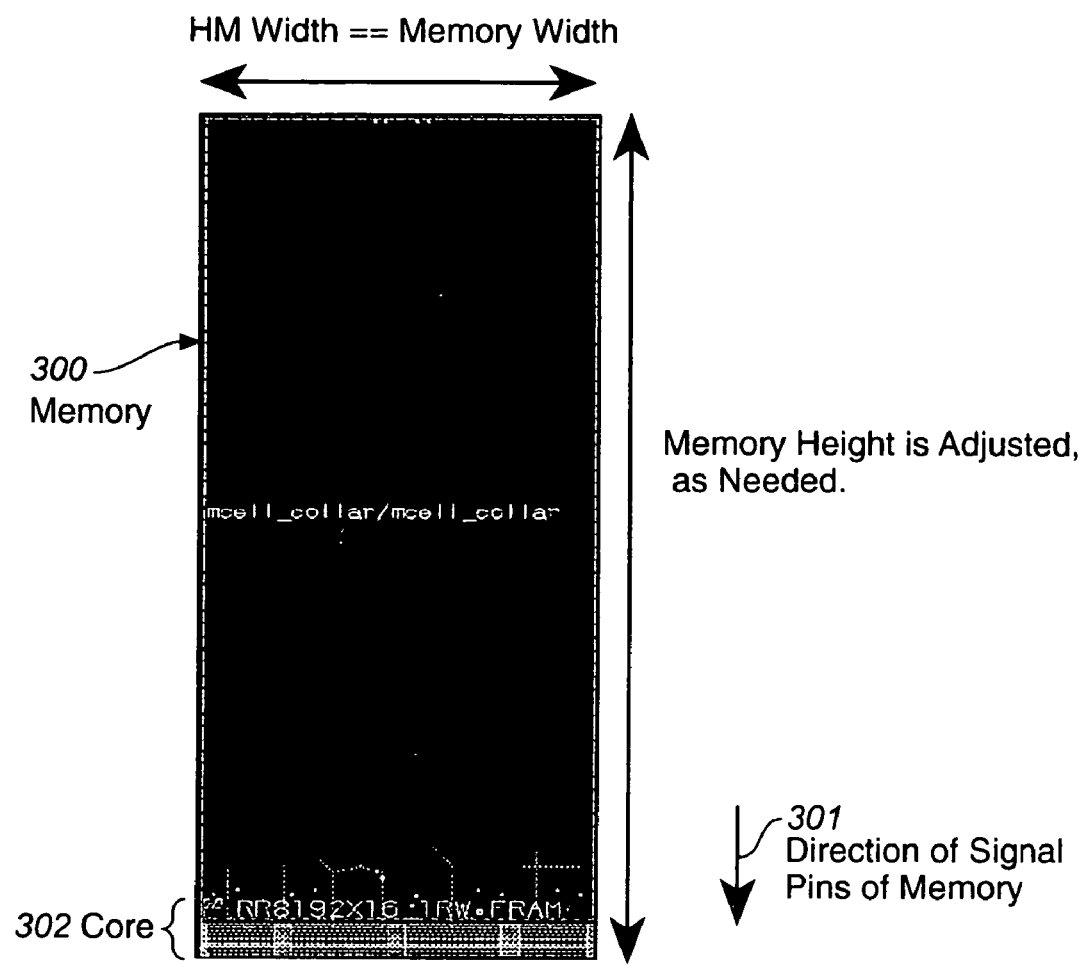
FIG._4

AUTOMATIC METHOD AND SYSTEM FOR INSTANTIATING BUILT-IN-TEST (BIST) MODULES IN ASIC MEMORY DESIGNS

CROSS-REFERENCE TO RELATED APPLICATIONS

The present invention is a Divisional Application of U.S. application Ser. No. 09/978,141, entitled "Automatic Method And System for Instantiating Built-in-Test (BIST) Modules in ASIC Memory Designs" filed on Oct. 15, 2001, now U.S. Pat. No. 6,931,606B1 and incorporated herein by reference.

FIELD OF THE INVENTION

The present invention relates to ASIC design methodologies, and more particularly to a Web-based method and system for automatically instantiating built-in-in-test (BIST) modules in memory designs.

BACKGROUND OF THE INVENTION

With innovative technologies, ASIC manufacturers are able to deliver system complexities up to 15-million gates on a single chip. Complete systems comprising cores, memories, and random logic are integrated on a single piece of silicon. Designers may design and verify a complete system for sign-off by submitting complex system models to electronic design automation (EDA) and verification and floorplanning tools to design and verify the complete system, including the core.

Automated memory compilers provide designers with the ability to generate their own application-specific memory models for single and multi-port memories. These models are expressed in native VHDL and Verilog formats as well as in formats that can be used by synthesis tools and static timing analysis tools.

Whenever memories are integrated into an ASIC, appropriate tests have to be conducted to make sure that the ASIC is not shipped to customers with faulty memories. The assignee of the present invention fabricates ASIC RAM's with a built-in self test (RAMBIST) as the mechanism to test RAM's (Logicvision is one vendor that provides software tools that allow designers to generate RAMBIST structures).

A memory compiler creates RAMBIST memory structures so that memories are fully testable. A RAMBIST test controller writes marching patterns into memory, reads them back out, and reports manufacturing defects. In production-test mode, the RAMBIST controllers output a simple pass-fail signal, which speeds test results analysis.

A major obstacle to quickly implementing RAMBIST structures in ASICs is the complexity of the RAMBIST generation flow. As a natural extension of the ASIC domain, RAMBIST are designed using the same basic design flow traditionally employed for ASICs designers. Thus, designers have begun to use many of the same steps and checklists for ASIC memories as employed in ASIC development.

FIG. 1 is a block diagram illustrating a conventional ASIC design flow. The design flow includes a front-end design process that creates a logical design for the ASIC, and a back-end design process that creates a physical design for the ASIC. The front-end design process begins with providing a design entry 10 for an electronic circuit that is used to generate a high-level electronic circuit description, which is typically written in a Hardware Description Language (HDL) 12. Although many proprietary HDLs have been developed, Verilog and VHDL are the major standards.

The design includes a list of interconnections that need to be made between the cells of the circuit; but physical properties for the interconnects have yet to be determined. Therefore, the designer needs an estimation of physical properties to help determine timing within circuit. Interconnect data from previous designs are used to generate interconnect statistical data to use as the estimation in step 14. The interconnect statistical data is used to create a wire load model 16, which defines the resistance, capacitance, and the area of all nets in the design. The statistically generated wire load model 16 is used to estimate the wire lengths in the design and define how net delays are computed.

The HDL 12 and the wire load model 16 are then input into a logic synthesis tool 18 to generate a list of logic gates and their interconnections, called a "netlist" 20. It is important to use wire load models 16 when synthesizing a design, otherwise, timing information generated from synthesis will be optimistic in the absence of net delays. The timing information will also be inaccurate when a poor wire load model 16 is used.

Next, system partitioning is performed in step 22 in which the physical design is partitioned to define groupings of cells small enough to be timed accurately with wire load models 16 (local nets). The resulting design typically includes many cells with many interconnect paths. A prelayout simulation is then performed in step 24 with successive refinement to the design entry 10 and to logic synthesis 18 to determine if the design functions properly.

After prelayout simulation 24 is satisfactory, the back-end design process begins with floorplanning in step 26 in which the blocks of the netlist 20 are arranged on the chip. The location of the cells in the blocks are then determined during a placement process in step 28. A routing process makes connections between cells and blocks in step 30. Thereafter, circuit extraction determines the resistance and capacitance of the interconnects in step 32. A postlayout simulation is then performed in step 34 with successive refinement to floorplanning 26 as necessary.

A RAMBIST generation flow is similar, but currently encompasses approximately nineteen discrete steps and involves the use of both internal software programs developed by the ASIC vendor plus various third party tools.

Although the generation flow utilizes software tools, the flow is basically a manual one that is based on the experience of the designer, and which causes the designer to complete the design using trial and error. For example, throughout the design process, designers must invoke the correct software tool and enter input into individual command lines. During floor-planning and placement, designers use their experience to arrange the initial placement of the cells, resulting in layouts that may not optimize density. In addition, the design flow is not perceived by the customers of ASIC manufacturers as adding value. Therefore, ASIC manufacturers must perform this complex, time-consuming service for free.

Accordingly, what is needed is an improved method for performing the instantiating BIST modules in ASIC memory designs. The present invention addresses such a need.

SUMMARY OF THE INVENTION

The present invention provides a method and system for automatically instantiating built-in-system test (BIST) modules in memory designs. The method and system include providing a server over a network that integrates a set of design tools, including an automated front-end software process and an automated back-end software process. According to the method and system, a user may access the server over the network and enter a request for a memory design. The front-end software process is then executed to automatically generate a netlist of a BIST from the user request. Thereafter, the back-end software process is executed to automatically generate a placement and route view of the BIST.

According to the system and method disclosed herein, the present invention provides an automated expert system for automating the front-end and back-end design flow process via a Web server, thereby eliminating the need for manual input and trial-and-error techniques inherent in the traditional design process.

BRIEF DESCRIPTION OF THE DRAWINGS

FIG. 1 is a block diagram illustrating a conventional design flow for fabricating an ASIC.

FIG. 2 is a block diagram illustrating an automated design flow expert system in accordance with a preferred embodiment of the present invention.

FIG. 3 is a flow chart illustrating the process steps performed by the automated placement and routing back-end software process in accordance with a preferred embodiment of the present invention.

FIG. 4 is a block diagram showing a memory.

DETAILED DESCRIPTION

The present invention relates to a Web-based method and system for automatically instantiating built-in-in-test (BIST) modules in memory designs. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a web-based expert system that allows users to automatically instantiate built-in-test modules in memory designs over the Internet. Although the preferred embodiment of the present invention will be described in terms of generating BISTs for RAMS (RAM-BIST), the present invention could also be used for ROM-BIST, and even for automating the entire ASIC design flow.

FIG. 2 is a block diagram illustrating an automated design flow expert system in accordance with a preferred embodiment of the present invention. The expert system 50 comprises a Web server 52 that is connected to a network, such as the Internet, that integrates a set of design tools. The design tools are implemented within a front-end software process 54, and a back-end software process 56. The front-end and back-end software processes 56 may be stored within the Web server 52, or located remote from the Web server 52.

In operation, a user 58 accesses the Web server 52 over the Internet via a standard Web browser 60 and makes a request 62 for a memory design. In a preferred embodiment, the user 58 makes the request 62 by entering data into a form along with a pointer to a user input script file containing a series of input command lines. The data entered by the user 58 may specify the number of words and bits in the RAM, and optionally the name of the RAM.

The Web server 52 uploads the request 62 and transfers the request 62 to the front-end software process 54, which uses the data in the request 62 to automatically generate a netlist 64 for a BIST module. In a preferred embodiment, the Web server 52 separates the request 62 into separate input command lines (not shown) and sequentially passes the command lines to the front-end software process 54. The input command lines are then automatically input into the appropriate software design tools necessary for generating the netlist 64 (which is illogical description of cells and interconnects in the design that must be converted into a physical description). The back-end software process 56 takes the netlist 64 and automatically generates a fully placed and routed design, and outputs a placement and route view, called a RAMBIST hardmacro 66. Thus, the web-based expert system 50 provides a centralized automatic design tool that allows customers to generate a design flow directly over the web and eliminates the need for manual input and trial-and-error by ASIC manufacturer designers.

According to another aspect of the present invention, the back-end software process 56 is automated using an iterative algorithm that generates an initial size estimate of the area needed for the memory and then attempts to perform placement and global routing. The algorithm assesses whether the allocated area is sufficient, and if not, the algorithm increments the size of the area and iterates again.

FIG. 3 is a flow chart illustrating the process steps performed by the automated placement and routing back-end software process 56 in accordance with a preferred embodiment of the present invention. The back-end software process 56 begins by receiving the netlist 64 generated by the front-end software process 54 as input in step 200. The back-end software process 56 then generates an initial estimate of the area required for the memory and allocates the memory area for the routing and placement steps in step 202. In a preferred embodiment, the memory size is estimated by counting the number of cells in the netlist 64 and then dividing that number by a constant. In a preferred embodiment, the constant is 5000 cells per square mm for current technologies. After the area has been allocated, the back-end software process 56 performs an initial placement of the cells in the allocated memory in step 204.

It is then determined whether the initial placement of the cells in the allocated memory was successful in step 206. In a preferred embodiment of the present invention, the placement and routing algorithm incorporates conventional MRS/MPS-based (Standard Logic Placement And Resytnthesis) algorithms as engines, but automates the use of these engines using a heuristic algorithm to determine success or failure. In a preferred embodiment, the heuristics for determining whether detail placement can proceed include the following steps:

1) Run placement
2) Run Global Routing
3) Calculate congestion
4) If more then 5% of nets have potential congestion, increase area by one row, then go back to step 1)
5) If cell utilization is too high, add enough rows to place all cells, then go back to step 1)
6) Otherwise, proceed to detail routing If it is determined that initial placement of cells was unsuccessful in step 206, then a minimum amount of additional area is allocated to the memory in step 208, and the process starts over with the placement of cells. In a preferred embodiment, the minimum amount of additional area is determined based on heuristics that use the average number of cells in the netlist 64, the average wire length, and congestion.

More specifically, as shown in FIG. 4 showing a memory, the memory 300 is preferably orientated such a that signal pins 301 occur on the bottom, and the bottom region of the memory 300 is the core area 302 where standard cell placement and routing for the RAMBIST hardmacro 66 will reside. The width of the overall RAMBIST hardmacro 66 is set to match the width of the memory 300. During the cell placement and routing steps, a minimum amount of area is added to the memory 300 by incrementing the height of the memory 300 incremented by adding one row at a time until it is determined that the memory 300 design can be routed without size or timing violations.

If it is determined that the initial placement of the cells in the allocated area was successful in step 206, then the process proceeds to step 210 where the back-end software process 56 performs global routing for large signals, including clocks and resets. If it is determined that the global routing was unsuccessful in step 212, then the process proceeds to step 208 where the size of the memory 300 is incremented by a minimum amount and iterates again.

If it is determined that the global routing was successful in the allocated memory 300 in step 212, then the back-end software process 56 performs detail routing of local nets in step 214. If it is determined at the detail routing was unsuccessful in step 216, then the process proceeds to step 208 and iterates again. If it is determined that the detail routing was successful in step 216, then the process outputs the RAMBIST hardmacro 66 in step 218, which includes a new netlist and a cell placement and routing view of the design.

According to the back-end software process 56 of the present invention, heuristics are used that forecast whether the next steps in the process can be accomplished, and if not the steps are avoided. It is particularly advantageous to avoid performing detail routing, which is complicated and time-consuming, for designs that will ultimately fail given allocated area. In addition, although incrementing the area size by a minimum amount may result in additional iterations, but iteratively making the area larger until the cells fit ensures that the resulting layout will be as dense as possible.

According to the present invention, the expert system 50 provides an automated front-end and back-end design flow via a Web server 52 over the Internet, thereby eliminating the manual trial-and-error method of conventional design flows. In addition, the expert system 50 of the present invention results in increased performance metrics about to 25% in the density of hardmacro layouts over prior techniques. The back-end software process 56 also reduces the time for placement and routing from 10 hours to approximately two hours.

A web-based method and system for automatically instantiating built-in-in-test (BIST) modules in memory designs has been disclosed. The present invention has been described in accordance with the embodiments shown, and one of ordinary skill in the art will readily recognize that there could be variations to the embodiments, and any variations would be within the spirit and scope of the present invention. In addition, software written according to the present invention may be stored on a computer-readable medium, such as a removable memory, or transmitted over a network, and loaded into a computer for execution. Accordingly, many modifications may be made by one of ordinary skill in the art without departing from the spirit and scope of the appended claims.

What is claimed is:

1. A computer implemented method for performing automatic placement and routing by a back-end software process, the method comprising the steps of:
   a. generating an initial size estimate of an area needed for a memory;
   b. allocating the memory of the estimated size;
   c. performing placement and routing; and
   d. assessing whether the allocated memory is sufficient, and if not, incrementing the size of the memory and iterating again.

2. The computer implemented method of claim 1 wherein step (a) further includes the step of receiving a netlist comprising a logical description of cells and interconnects in a design as input.

3. The computer implemented method of claim 2 wherein step (a) further includes the step of generating the initial size estimate by counting a number of cells in the netlist and dividing by constant.

4. The computer implemented method of claim 3 wherein step (c) further includes the step of:
   (i) performing an initial placement of cells in the allocated memory;
   (ii) determining if the initial placement of cells in the allocated memory is successful;
   (iii) if the initial placement of cells in the allocated memory is successful, performing global routing for large signals;
   (iv) determining if the global routing in allocated memory is successful; and
   (iv) if the global routing and allocated memory is successful, performing detail routing for local nets.

5. The computer implemented method of claim 4 further including the step of using a heuristic algorithm to determine success and failure.

6. The computer implemented method of claim 5 further including the step of incrementing the allocated memory by a minimum amount when failure is determined.

7. The computer implemented method of claim 6 further including the step of incrementing the allocated memory by one row at a time until it is determined that the allocated memory can be placed and routed without size or timing violations.

8. A computer readable medium containing program instructions for performing automatic placement and routing by a back-end software process, the back-end software process comprising the steps of:
   a. generating an initial size estimate of an area needed for a memory;
   b. allocating the memory of the estimated size;
   c. performing placement and routing; and
   d. assessing whether the allocated memory is sufficient, and if not, incrementing the size of the memory and iterating again.

9. The computer readable medium of claim 8 wherein instruction (a) further includes the instruction of receiving a netlist comprising a logical description of cells and interconnects in a design as input.

10. The computer readable medium of claim 9 wherein instruction (a) further includes the instruction of generating the initial size estimate by counting a number of cells in the netlist and dividing by constant.

11. The computer readable medium of claim 10 wherein instruction (c) further includes the instruction of:
   i. performing an initial placement of cells in the allocated memory;
   ii. determining if the initial placement of cells in the allocated memory is successful;
   iii. if the initial placement of cells in the allocated memory is successful, performing global routing for large signals;
   iv. determining if the global routing in allocated memory is successful; and
   v. if the global routing and allocated memory is successful, performing detail routing for local nets.

12. The computer readable medium of claim 11 further including the instruction of using a heuristic algorithm to determine success and failure.

13. The computer readable medium of claim 12 further including the instruction of incrementing the allocated memory by a minimum amount when failure is determined.

14. The computer readable medium of claim 13 further including the instruction of incrementing the allocated memory by one row at a time until it is determined that the allocated memory can be placed and routed without size or timing violations.

* * * * *